United States Patent
Sunahara

[11] Patent Number: 6,153,290
[45] Date of Patent: Nov. 28, 2000

[54] MULTI-LAYER CERAMIC SUBSTRATE AND METHOD FOR PRODUCING THE SAME

[75] Inventor: Hirofumi Sunahara, Moriyama, Japan

[73] Assignee: Murata Manufacturing Co., Ltd., Japan

[21] Appl. No.: 09/221,466

[22] Filed: Dec. 28, 1998

[30] Foreign Application Priority Data

Jan. 6, 1998 [JP] Japan .................. 10-000584

[51] Int. Cl.⁷ .................................. B23B 17/00
[52] U.S. Cl. .................. 428/210; 361/763; 361/793; 29/832; 156/89
[58] Field of Search ................. 361/762, 763, 361/793; 428/209, 210; 29/832; 156/89

[56] References Cited

U.S. PATENT DOCUMENTS

| | | | |
|---|---|---|---|
| 4,109,296 | 8/1978 | Rostek et al. | 361/763 |
| 4,811,164 | 3/1989 | Ling et al. | 361/321 |
| 4,899,118 | 2/1990 | Polinski, Sr. | 333/246 |
| 5,055,966 | 10/1991 | Smith et al. | 174/52.4 |
| 5,315,486 | 5/1994 | Fillion et al. | 361/762 |
| 5,384,434 | 1/1995 | Mandai et al. | 174/258 |
| 5,387,888 | 2/1995 | Eda et al. | 333/247 |
| 5,416,277 | 5/1995 | Zimmermann et al. | 174/257 |
| 5,708,559 | 1/1998 | Brabazon et al. | 361/321.3 |
| 5,708,570 | 1/1998 | Polinski, Sr. | 361/762 |
| 5,757,611 | 5/1998 | Gurkovish et al. | 361/321.3 |
| 5,814,366 | 9/1998 | Fukuta et la. | 427/96 |
| 6,021,050 | 2/2000 | Ehman et al. | 361/763 |

FOREIGN PATENT DOCUMENTS 60-166289  8/1985  Japan .
61-288498  12/1986  Japan .

OTHER PUBLICATIONS

Patent Abstracts of Japan; vol. 017, No. 085 (E–1322); Feb. 19, 1993 & JP 04 280496 A (Narumi China Corp.); Oct. 6, 1992; Abstract.
Patent Abstracts of Japan; vol. 016; No. 415 (E–1257); Sep. 2, 1992 & JP 04 139794 A (Kyocera Corp.); May 13, 1992; Abstract.
Patent Abstracts of Japan; vol. 013, No. 461 (C–645); Oct. 18, 1989 & JP 01 179741 A (Asahi Glass Co., Ltd.); Jul. 17, 1989; Abstract.

*Primary Examiner*—Cathy F. Lam
*Attorney, Agent, or Firm*—Ostrolenk, Faber, Gerb & Soffen, LLP

[57] ABSTRACT

The present invention provides a method for producing a high-density multi-layer ceramic substrate with stable characteristics, the substrate incorporating therein a passive component such as a high-precision capacitor or inductor. The method comprises the steps of providing compact blocks containing a green ceramic functional material to form the passive components; providing a composite green laminate having a plurality of ceramic green sheets comprising a ceramic insulating material and in which the compact blocks are built in pre-disposed spaces and a paste containing a metal inducing, during firing, oxidation reaction accompanied by expansion is provided in space between inside walls of the spaces and the compact blocks; firing the composite green laminate in a state in which the laminate is sandwiched by the sheet-like supports formed of green ceramics that cannot be sintered at the sintering temperature, so as to prevent shrinkage of the laminate; and removing the unsintered sheet-like supports.

22 Claims, 2 Drawing Sheets

MULTI-LAYER CERAMIC SUBSTRATE AND METHOD FOR PRODUCING THE SAME

BACKGROUND OF THE INVENTION

1. Field of the Invention

The present invention relates to a multi-layer ceramic substrate and a method for producing the same, and more particularly, to a multi-layer ceramic substrate including passive components such as capacitors and inductors, and to a method for producing the same.

2. Description of the Related Art

As electronic devices have become smaller, there have generally been used ceramic substrates made of ceramic insulator and packed with various electronic components that constitute electronic circuitry. Recently, in order to attain an increased packing density and to meet high-frequency requirements, integral multi-layer ceramic substrates have been developed. These integral substrates are made by laminating a plurality of low dielectric constant ceramic sheets, each being provided with circuit patterns by use of paste containing a low-resistance conductive material such as Ag, Ag—Pd alloy, Cu, or Au, and firing the resultant laminate.

To attain even higher packing density, it would be advantageous to form a substrate by use of a material having a low dielectric constant and to construct a structure incorporating passive components therein two-dimensionally or three-dimensionally. Particularly, three-dimensional incorporation of passive components is more favorable than two-dimensional incorporation, in view of packing density, degree of freedom in circuit design, and electrical characteristics. Achieving three-dimensional incorporation requires a so-called heterologous material-joined substrate in which the substrate material and the material for passive components are combined, the material for passive components being heterologous to the former material and including a capacitor material, inductor material, resistor material, etc. having a dielectric constant different from that of the substrate material.

To obtain such a three-dimensional passive-component inclusion structure, the following methods have conventionally been used.

A first method is called a thick-film method. The thick-film method includes the steps of printing patterns by use of dielectric paste and the like on green sheets which are to be formed into substrates by means of a thick-film forming technique, stacking the green sheets and joining them with pressure, and firing the sheets to partially include capacitors and the like in finished multi-layer ceramic substrates. This method involves the following drawbacks:

(1) Because variation in thickness of paste on the sheet is rather large and precision of printing the paste is insufficient, variation in capacitance or other characteristics is rather large.

(2) The paste on the green sheet is deformed in processes of pressure-joining the sheets and firing, which may cause variation in capacitance and like characteristics.

(3) Repeated printing and lamination of the sheets leads to deteriorated surface flatness of the printed portion, making it difficult to increase the number of sheets of the laminate or, in the case of a capacitor, to increase capacitance thereof.

A second method is described in Japanese Patent Application Laid-Open (kokai) No. 288498/1986. According to this method, chip-type ceramic passive components sintered in advance are incorporated interior of a laminate formed of a plurality of ceramic green sheets which are to be formed into a substrate. This process may overcome the drawbacks involved in the first method; however, shrinkage behavior must be strictly controlled in the X, Y, and Z directions of ceramic green sheets, and the method has another drawback in that the materials which can be used as ceramic green sheets for providing substrates are considerably limited. In addition, the method involves the following problems:

(1) When chip-type passive components are included within the space formed in a substrate, undesired gaps tend to be formed between the passive components and the corresponding inner surfaces extending perpendicular to the lamination planes, which gaps may cause formation of depressions at the surface of a substrate. Particularly, when the substrate is made of a glass-containing material, depressions become more significant, and in the worst case, cracks extending perpendicular to the lamination planes may be generated in the surface of the substrate or in the interface between the passive components and the substrate.

(2) The flatness of the substrate tends to deteriorate.

(3) Attaining a high dimensional precision is difficult.

(4) Formation of minute wiring is difficult.

As conventional methods to enable formation of high-density wiring in a multi-layer circuit substrate, the following methods are known. Japanese Patent Application Laid-Open (kokai) No. 4-243978, for example, discloses a method in which a dummy green sheet is pressure-joined onto each of the upper and lower surfaces of a laminate body to serve as a substrate including a plurality of green sheets that can be fired at low temperature, wherein the dummy green sheet does not shrink at the firing temperature of the laminate body; then the resultant pressure joined product is fired at a relatively low temperature; and subsequently the unsintered layer attributed to the dummy green sheet is removed by peeling it off after firing. Japanese Kohyo Publication No. 5-503498 discloses a modified technique of this method; pressure is further applied onto a laminate to be formed into a substrate in a direction perpendicular to the laminate planes during firing.

According to these methods, shrinkage does not occur easily in the X-Y plane, or in other words, in directions parallel to the laminate planes. Therefore, improved dimensional precision of the resultant substrate can be obtained, providing an advantage that breakage of wiring will not easily occur even when the substrate has high density wiring. However, these methods are not drawn to the case in which passive components are contained interior of a substrate.

Turning again to a method for producing multilayer circuit boards which contain passive components, a third method is disclosed in Japanese Patent Application Laid-Open (kokai) No. 9-92983. This publication discloses a method which combines the following two methods; one method being directed to prevention of the aforementioned shrinkage in the X-Y plane of a substrate, and the other method being directed to partial incorporation, into a multi-layer circuit board, of a capacitor in the form of a sheet or thin film. This method is suitable for the production of multi-layer circuit boards incorporating passive components therein and having a high density wiring.

In this third method, when the dielectric portion is made of a sheet, a dielectric layer having the same area as that of the substrate is provided. As a result, the dielectric layer is exposed in an edge face of the substrate, and thus, the dielectric layer must be dense enough not to permit penetration of moisture. To meet this requirement, pressure is applied onto the substrate from both the upper and lower surfaces thereof during firing, to thereby make the dielectric layer sufficiently dense. However, the restriction in shape of the dielectric layer causes, among others, the following drawbacks:

(1) Low level of freedom in design, due to laminar placement of the dielectric in a substrate, and (2) Problems such as crosstalk of signals tend to occur.

In the above-mentioned third method, when the dielectric portion is formed by use of a thick film, there is sometimes included a step in which a depressed portion is formed in the sheet for substrate such that the depression corresponds to the region in which a dielectric portion is to be formed, and subsequently the depression is filled with a dielectric paste. In this case, among the problems involved in the aforementioned first method, i.e., the thin-film method, positional deviation of the thick film and variation in characteristics which may be caused by deformation of the dielectric paste during pressure-bonding of substrate sheets can be avoided; however, variation in thickness of the paste still remains, through it may become less significant. Moreover, since the dielectric portion is difficult to form into a laminate structure, there remains another problem in that large capacity cannot be easily obtained.

SUMMARY OF THE INVENTION

In view of the foregoing, an object of the present invention, which solves the above-mentioned problems, is to provide a method for producing a multilayer ceramic substrate which incorporates a passive component therein and realizes multi-functions, high packing density, and high precision, and to provide a multi-layer ceramic substrate obtained through the method.

Accordingly, the present invention is directed to a multi-layer ceramic substrate which includes a laminate having a plurality of laminated ceramic layers formed of a ceramic insulating material and a wiring conductor, and a passive component built into the laminate and being wired through the wiring conductor. In order to solve the above-mentioned technical problems, the mentioned passive component is formed by monolithically sintering a compact block containing a green ceramic functional material which is to serve as the passive component, the compact block being built into a space within the laminate, and the sintering is performed simultaneously with firing of the laminate. Also, an interposed layer is formed at least between the passive component and an inside wall extending in a direction perpendicular to lamination planes of the laminate, the interposed layer being obtained by firing, during the step of firing the laminate, a mixture containing a metal which during firing induces an oxidation reaction accompanied by expansion or a mixture containing the metal and an optional inorganic compound.

The above-described interposed layer is preferably disposed also on an inside wall extending in a direction parallel to the lamination planes of the laminate or on the inside wall and a face extending therefrom.

The present invention is also directed to a method for producing a multi-layer ceramic substrate which includes a laminate having a plurality of laminated ceramic layers formed of a ceramic insulating material and a wiring conductor, and a passive component built into the laminate and being wired through the wiring conductor. In order to solve the above-mentioned technical problems, the method comprises the steps of:

providing a compact block to form the passive component which contains a green ceramic functional material;

providing a composite green laminate, wherein the composite green laminate contains a wiring conductor and a plurality of laminated ceramic green sheets comprising a ceramic insulating material different from the ceramic functional material contained in the compact block, the compact block being built within a space predisposed in the green laminate, and a paste containing a metal which during firing induces an oxidation reaction accompanied by expansion or a paste containing said metal and an optional inorganic compound being provided within a gap at least between an inside wall extending perpendicular to the lamination planes of the laminate and the compact block;

disposing, on each of the principal surfaces located at both ends of the composite green laminate with respect to a direction perpendicular to the lamination planes of the laminate, a sheet-like support formed of a green ceramic which is not sintered at the firing temperature of the composite green laminate;

firing the composite green laminate in a state in which the composite green laminate is sandwiched by the sheet-like supports; and removing the unsintered sheet-like support.

In the above-described space of the provided composite green laminate, there is preferably provided a paste which contains a metal which during firing induces oxidation reaction accompanied by expansion and an optional inorganic compound also between an inside wall extending parallel to the lamination planes of the laminate and the above-described compact block, or on the inside wall and a face extending therefrom.

In the step of firing the above-mentioned composite green laminate, a load is preferably applied perpendicular to the lamination planes of the composite green laminate via a sheet-like support.

The step of firing the composite green laminate is preferably performed at about 1000° C. or less. When the composite laminate is fired at 1000° C. or less, the sheet-like support may contain, e.g., alumina or zirconia.

In the present invention, the metal which is used to form the interposed layer is preferably at least one species selected from the group consisting of Al, Si, Ti, Fe, Cu, Mo, W, Cr and Zn.

Also, in the present invention, the inorganic compound in a mixture containing a metal and an inorganic compound or in a paste preferably include ceramics, glass, or a mixture of ceramics and glass.

The proportion by weight of the above-mentioned metal and the inorganic compound are preferably about 100/0 to 5/95.

The passive component which is advantageously applied to the multi-layer ceramic substrate and the method for producing the same according to the present invention includes a capacitor, an inductor and the like. In the present invention, the passive component which is built into the ceramic substrate is not limited to a single component such as a capacitor or an inductor, and also includes a composite thereof such as an LC composite component which comprises a combination of a capacitor and an inductor.

As the compact block, there is advantageously employed a compact block having a layer structure providing multi-layer internal conductors.

The ceramic functional materials contained in the compact block preferably comprise glass ceramics or a mixture of glass and ceramics.

The ceramic insulating materials contained in the ceramic green sheet provided for the composite laminate contain glass or a mixture of glass and ceramics, and the proportions by weight of glass and ceramics are preferably about 100/0 to 5/95.

The wiring conductor or internal conductor preferably contains as a primary component at least one species selected from the group consisting of Ag, Ag—Pt alloy, Ag—Pd alloy, Au, Ni, Pd, Pt, W, Mo and Cu.

Other features and advantages of the present invention will become apparent from the following description of the invention which refers to the accompanying drawings.

PREFERRED EMBODIMENTS OF THE PRESENT INVENTION

Figure 1:
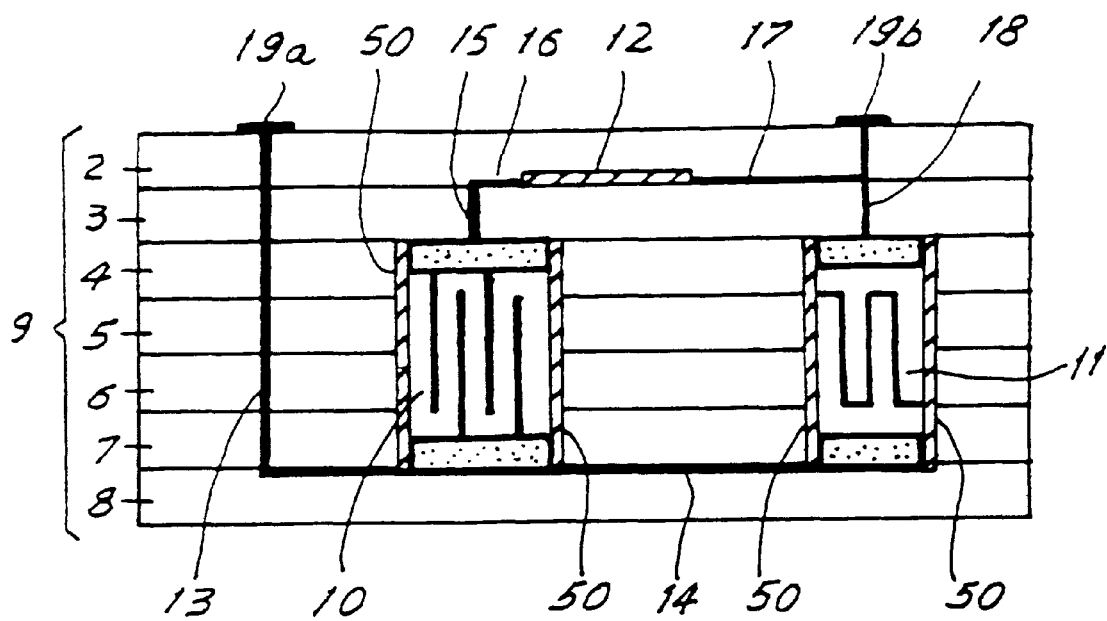
FIG. 1 is a cross-sectional view of a multi-layer ceramic substrate 1 according to one preferred embodiment of the present invention.
Figure 2:
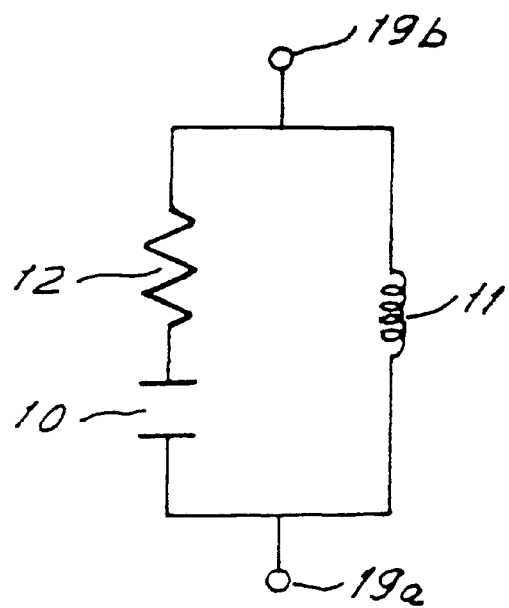
FIG. 2 is an equivalent circuit diagram derived from the multi-layer circuit substrate 1 shown in FIG. 1.

As shown in FIG. 1, the multi-layer ceramic substrate 1 includes a laminate 9 having a plurality of laminated ceramic layers 2, 3, 4, 5, 6, 7 and 8 formed of a ceramic insulating material. A capacitor 10, an inductor 11 and a resistor 12 are built into the laminate 9 as passive components. The laminate 9 is provided with wiring conductors 13, 14, 15, 16, 17 and 18 for completing wiring among the capacitor 10, the inductor 11 and the resistor 12, and outer terminal conductors 19a and 19b disposed on the outer surface of the multi-layer ceramic substrate 1. Thus, the multi-layer ceramic substrate 1 constitutes a circuit shown in FIG. 2.

The multi-layer ceramic substrate 1 having the foregoing construction is produced as follows. FIG. 4 is a cross-sectional view for describing a method for obtaining some of the components shown in FIG. 3.

There are individually provided a compact block for producing a capacitor 10g containing a green ceramic functional material used for forming the above-mentioned capacitor 10 and a compact block for producing an inductor 11g containing a green ceramic functional material used for forming the inductor 11.

The compact block for producing a capacitor 10g contains a ceramic dielectric material and has a lamination structure wherein a multi-layer internal conductor 21 is formed from a dielectric green sheet 20 containing the ceramic dielectric material. Terminal electrodes 22 and 23 are formed on opposing edge surfaces of the compact block 10g. The internal conductors 21 are alternately connected to the terminal electrode 22 and the terminal electrode 23, as in the case of an internal electrode in known laminated ceramic capacitors.

The compact block for producing an inductor 11g contains a ceramic magnetic material serving as a ceramic functional material and has a lamination structure wherein a multi-layer internal conductor 25 is formed from a magnetic material sheet 24 containing the ceramic magnetic material. Terminal electrodes 26 and 27 are formed on opposing edge surfaces of the compact block 11g. The internal conductors 25 are connected to one another through, for example, a via-hole conductor 28 which penetrates magnetic sheets 24, and constitute in their entirety a coil-like conductor path.

The compact block 10g and the compact block 11g are preferably firable at about 1000° C. or less. Therefore, glass ceramics or a mixture of glass and ceramics are advantageously employed as ceramic materials, i.e., ceramic dielectric materials and ceramic magnetic materials. More specifically, through a doctor blade method, a ceramic slurry obtained by mixing an organic vehicle with a barium titanate powder containing a small amount of borosilicate glass is molded into a sheet, which may be used as the dielectric material sheet 20. Meanwhile, through a doctor blade method, a ceramic slurry obtained by mixing an organic vehicle with a nickel zinc ferrite powder containing a small amount of borosilicate glass is molded into a sheet, which may be used as the magnetic material sheet 24.

As conductors forming the internal conductor 21, the terminal electrodes 22 and 23, the internal conductor 25, the terminal electrodes 26 and 27 and the via-hole conductor 28, there is advantageously employed an electrically conductive paste containing as a primary component at least one species selected from the group consisting of Ag, Ag—Pt alloy, Ag—Pd alloy, Au, Ni, Pd, Pt, W, Mo and Cu.

The internal conductors 21 and 25 may be formed by applying the above-mentioned conductive paste onto the dielectric material sheet 20 and the magnetic material sheet 24, respectively, through screen printing to thereby provide a specific pattern.

In order to obtain the compact blocks 10g and 11g, as mentioned above, a predetermined number of the dielectric material sheets 20 in which the internal conductors are formed and a predetermined number of the magnetic material sheets 24 in which the internal conductors 25 are formed are laminated, respectively, and the resultant laminates are preferably subjected to a press-bonding step wherein, for example, a hydro-pressure of 200 kg/cm² is applied.

There are also provided ceramic green sheets 2g, 3g, 4g, 5g, 6g, 7g and 8g containing a ceramic insulating material for forming the above-mentioned ceramic layers 2 through 8. These ceramic insulating materials contained in the ceramic green sheets 2g through 8g are different from those contained in the above-mentioned compact blocks 10g and 11g.

The ceramic green sheets 2g through 8g are processed or treated in advance so as to form the above-mentioned compact block for producing a capacitor 10g and the compact block for producing an inductor 11g or to form the above-mentioned resistor 12, wiring conductors 13 through 18 and external terminal conductors 19a and 19b.

More specifically, a series of via-holes 30, 31, 32 and 33 which collectively form a space 29 for receiving the above-mentioned compact block for producing a capacitor 10g and a series of via-holes 35, 36, 37 and 38 which collectively form a space 34 for receiving the above-mentioned compact block for producing an inductor 11g are disposed in advance on the ceramic green sheets 4g, 5g, 6g and 7g, respectively.

Also, a series of via-holes 39, 40, 41, 42, 43 and 44 for forming the wiring conductor 13 are disposed in advance on the ceramic green sheets 2g, 3g, 4g, 5g, 6g and 7g, respectively. A via-hole 45 for forming the wiring conductor 15 is disposed in advance on the ceramic green sheet 3g. A series of via-holes 46 and 47 for forming the wiring conductor 18 are disposed in advance on the ceramic green sheets 2g and 3g, respectively. In the via-holes 39 through 47, an electrically conductive paste is provided for forming wiring conductors 13, 15 and 18.

Through a method such as screen printing, to the ceramic green sheet 2g is applied an electrically conductive paste which forms the external terminal conductors 19a and 19b, so as to come in contact with the conductive paste in the via-holes 39 and 46, respectively.

Through a method such as screen printing, to the ceramic green sheet 3g is applied an electrically conductive paste which forms the wiring conductors 16 and 17, so as to come in contact with the conductive paste in the via-holes 45 and 47, respectively. A thick-film resistor forming the resistor 12 is provided so as to connect the electrically conductive paste forming the wiring conductor 16 and that forming the wiring conductor 17. As the resistor paste which forms the thick-film resistor, there is advantageously used a mixture of an organic vehicle and a ruthenium oxide powder containing a small amount of borosilicate glass.

Through a method such as screen printing, to the ceramic green sheet 8g is applied an electrically conductive paste forming the wiring conductor 14, so as to come in contact with an electrically conductive paste in the via-hole 44 and to expose it toward inside the spaces 29 and 34 when the ceramic green sheets 2g through 8g are laminated, i.e., so as to come in contact with the terminal electrodes 23 and 27 of the compact blocks 10g and 11g.

As the electrically conductive paste which provides the above-mentioned wiring conductors 13 through 18 and the external terminal conductors 19a and 19b, there is advantageously employed an electrically conductive paste containing as a primary component at least one species selected from the group consisting of Ag, Ag—Pt alloy, Ag—Pd alloy, Au, Ni, Pd, Pt, W, Mo and Cu.

As the ceramic insulating materials contained in the ceramic green sheets 2g through 8g, there is preferably used an insulating material that is firable at about 1000° C. or less, such as glass or a mixture of glass and ceramics. In this case, the proportions by weight of glass and ceramics are about 100/0 to 5/95. When the proportions are less than about 5/95, the firable temperature becomes in excess of about 1000° C. This is disadvantageous in that selection of the materials such as the above-mentioned wiring conductors 13 through 18 is limited.

More specifically, with regard to the ceramic green sheets 2g through 8g, there may be used a ceramic slurry which is obtained by mixing an organic vehicle, a borosilicate glass powder and a barium titanate powder and molding the mixture into a sheet through a doctor blade method. The ceramic green sheets 2g through 8g obtained from such kinds of materials can be fired at a temperature as low as 800–1000° C.

By use of the thus-obtained compact blocks 10g and 11g and ceramic green sheets 2g through 8g, the composite green laminate 1g, which provides the multilayer ceramic substrate 1 when fired, is produced as follows.

First, the ceramic green sheets 4g through 7g are laminated in advance as shown in FIG. 4.

Next, there is applied a paste 50g containing a metal which during firing induces an oxidation reaction accompanied by expansion and an optional inorganic compound. The paste 50g is formed by kneading the above-mentioned metal powder and the optional inorganic compound powder by use of an organic vehicle in a known manner. As the metal contained in the paste 50g, there is advantageously used at least one species selected from the group consisting of Al, Si, Ti, Fe, Cu, Mo, W, Cr and Zn. As the inorganic compound, there are advantageously used ceramics, glass or a mixture of ceramics and glass. More specific examples include $Bi_2O_3$, CuO, $SiO_2$, $TiO_2$, CaO, and BaO. The proportions by weight of the above-mentioned metal and inorganic compound is preferably about 100/0 to 5/95. When the proportions are less than about 5/95 a poor effect is obtained due to expansion of the metal oxidized by firing.

As shown in FIG. 4, the paste 50g is applied on the inside walls of the spaces 29 and 34 formed on the laminated ceramic green sheets 4g through 7g and is also applied on the outside walls opposed to the inside walls of the spaces 29 and 34 that correspond to the outside surfaces of the compact blocks 10g and 11g.

Figure 3:
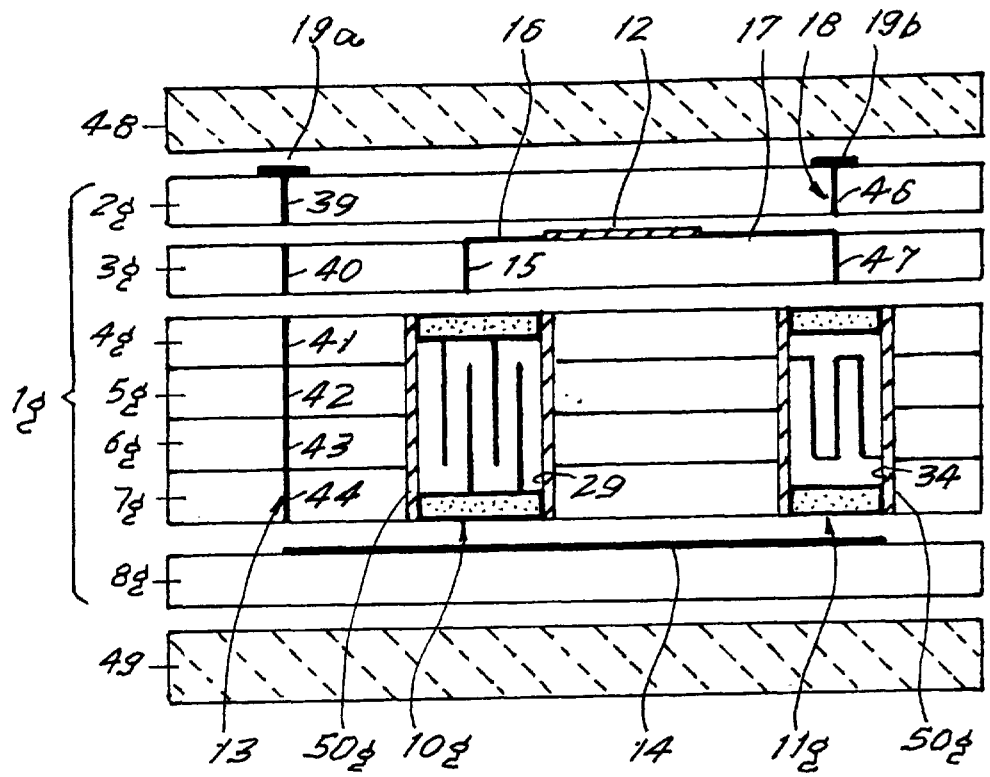
FIG. 3 is a cross-sectional view for describing a method for producing the multi-layer ceramic substrate 1 shown in FIG. 1, showing ceramic green sheets 2g through 8g, compact blocks 10g and 11g, and sheet-like supports 48 and 49.
Figure 4:
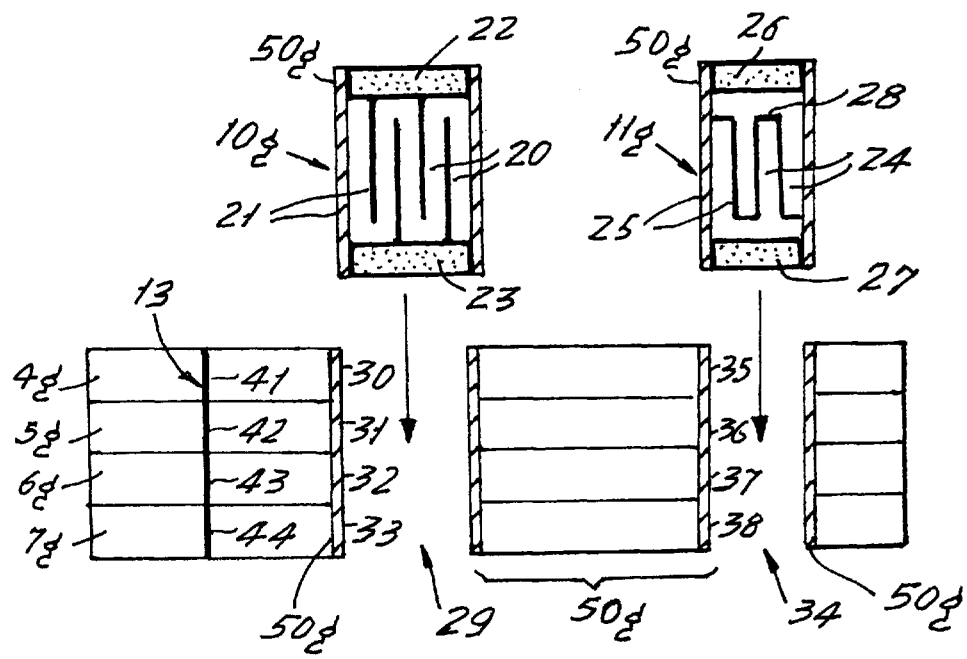
FIG. 4 is a cross-sectional view in which ceramic green sheets 4g through 7g and compact blocks 10g and 11g are shown separately.

Subsequently, as shown in FIG. 3, the compact blocks 10g and 11g are built into the spaces 29 and 34, respectively, to thereby position the paste 50g in the spaces 29 and 34 between the inside walls extending perpendicular to the lamination planes of the ceramic green sheets 4g through 7g and the compact blocks 10g and 11g, respectively. In order to obtain such positioning of the paste 50g, the paste may be applied on either of the inside walls of the spaces 29 and 34 and the outside walls of the compact blocks 10g and 11g, but not both.

When the compact blocks 10g and 11g are built into the spaces 29 and 34 as mentioned above, the terminal electrodes 22, 23, 26, and 27 are exposed from the respective openings of the spaces 29 and 34. Then, the step of press-bonding is performed at, for example, a hydro-pressure of 500 kg/cm$^2$, to thereby press-bond the ceramic green sheets 4g through 7g. Thus, interlayer adhesion among the ceramic green sheets 4g through 7g is enhanced and interspace adhesion between the compact blocks 10g and 11g and the paste 50g and that between the paste 50g and the inside walls of the spaces 29 and 34 are also enhanced.

Then, ceramic green sheets 2g and 3g are laminated on the above-mentioned ceramic green sheets 4g through 7g and a ceramic green sheet 8g is laminated beneath the green sheets 4g through 7g, to thereby obtain the composite laminate 1g. In the composite laminate 1g, an electrically conductive paste disposed in the via-holes 39 through 44 forms the wiring conductor 13 which is connected with the wiring conductor 14; an electrically conductive paste disposed in the via-hole 45 is connected with the terminal electrode 22 of the compact block 10g; and an electrically conductive paste disposed in the via-holes 46 and 47 forms the wiring conductor 18 and is connected with the terminal electrode 26 of the compact block 11g. The terminal electrodes 23 and 27 of the compact blocks 10g and 11g are connected with the wiring conductor 14.

As mentioned above, the paste 50g may be applied on the surfaces exposed from the openings of the spaces 29 and 34 in the compact block 10g and 11g before the ceramic green sheets 2g, 3g and 8g are laminated on and beneath the ceramic green sheets 4g through 7g, or the paste may be applied on the interface between the ceramic green sheets 3g and 4g or on the interface between the ceramic green sheets 7g and 8g. Needless to say, since the paste 50g must be applied under conditions such that the above-mentioned electric contact is not inhibited, application of the paste is not always be appropriate, but might be satisfactorily employed depending on the wiring conditions when the wiring shown in FIG. 3 is required.

Meanwhile, there are also provided the sheet-like supports 48 and 49 formed of green ceramics which are not sintered at the sintering temperature of the composite green laminate 1g. As mentioned above, when the compact blocks 10$g$ and 11$g$ and the ceramic green sheets 2$g$ through 8$g$ are firable at about 1000° C. or less, the composite green laminate 1$g$ obtained therefrom must be firable at about 1000° C. or less. Therefore, a material which is not sintered at about 1000° C. may be used as the material for producing the sheet-like supports 48 and 49. For example, there is advantageously used a ceramic slurry obtained by mixing an organic vehicle and a powder of ceramics such as alumina or zirconia, which is subsequently molded into a sheet.

The sheet-like supports 48 and 49 are disposed on the main surfaces located at the edges perpendicular to the lamination planes of the composite green laminate 1$g$, i.e., disposed on the two main surfaces. The composite green laminate 1$g$ is then press-bonded with the sheet-like supports 48 and 49. For example, a hydro-pressure of 1000 kg/cm$^2$ is applied during the press-bonding step.

Subsequently, the composite green laminate 1 g is fired, e.g., in air at 900° C., while being press-bonded with the sheet-like supports 48 and 49. During the firing step, the composite green laminate 1$g$ is preferably pressed perpendicular to the lamination planes via the sheet-like supports 48 and 49. Through the step, the compact blocks 10$g$ and 11$g$ are fired to thereby form the sintered capacitor 10 and inductor 11, respectively; the ceramic green sheets 2$g$ through 8$g$ are fired to thereby form the laminate 9 comprising the plurality of sintered ceramic layers 2 through 8; and the paste 50$g$ is fired to thereby form the sintered interposed layer 50. Thus, the completely sintered multi-layer ceramic substrate 1 is obtained.

Even when such a firing step is completed, the sheet-like supports 48 and 49 remain unsintered and are easily removed by peeling off. Thus, the desired multi-layer ceramic substrate 1 can be obtained by removing the sheet-like supports 48 and 49 after cooling.

Since the above-mentioned sheet-like supports 48 and 49 are not sintered during the firing step, no substantial shrinkage is generated. Therefore, there is advantageously suppressed shrinkage in the X-Y plane (lamination planes) of the composite green laminate 1 sandwiched by the sheet-like supports 48 and 49, i.e., the plane of the main surface main surfaces of the ceramic green sheets 2$g$ through 8$g$. This enhances the dimensional precision of the multi-layer ceramic substrate and prevents the occurrence of problems, e.g., breakage of minute and high-density wiring made of the wiring conductors 13 through 18. The capacitor 10, the inductor 11, and the resistor 12 are experimentally confirmed to show characteristics as designed.

As mentioned above, since the shrinkage in the X-Y plane is suppressed, the sintering behavior of the compact blocks 10$g$ and 11$g$ and the ceramic green sheets 2$g$ through 8$g$ may be easily synchronized during simultaneous firing thereof with the composite laminate 1$g$. Thus, there may be used any of a wide range of materials for producing the compact blocks 10$g$ and 11$g$ and the ceramic green sheets 2$g$ through 8$g$.

Expansion occurs when the paste 50$g$ is fired to form the interposed layer 50. More specifically, a metal contained in the paste 50$g$ during firing induces an oxidation reaction accompanied by expansion. When the paste 50$g$ contains no inorganic compound, after firing the interposed layer 50 comprises an oxide of the corresponding metal and the complex oxide formed by reaction between the metal and a ceramic component contained in the compact block 10$g$ or 11$g$ and the ceramic green sheets 4$g$ through 7$g$, which come in contact with the metal. When the paste 50$g$ contains a metal and an inorganic compound, after firing the interposed layer 50 comprises the above-mentioned metal oxide; a complex oxide formed by reaction between the metal and a ceramic component contained in the compact block 10$g$ or 11$g$ and the ceramic green sheets 4$g$ through 7$g$, which come in contact with the metal; an inorganic compound; and a complex compound formed by reaction between a metal and an inorganic compound. Expansion might also occur during the reaction between the metal and the inorganic compound.

In the case in which the paste contains both a metal and an inorganic compound, and the metal is Al and the inorganic compound is $Bi_2O_3$, examples of the formed complex compound include $Bi_2Al_4O_9$. Similarly, $CuAl_2O_4$, $Al_2SiO_5$ $TiAl_2O_5$, $CaAl_4O_7$ and $BaAl_{12}O_9$ may be formed as the complex compounds when $CuO$, $SiO_2$, $TiO_2$, $CaO$ and $BaO$, respectively, are used as the inorganic compounds.

Such expansion occurring when the paste 50$g$ is fired to form the interposed layer 50 acts to compensate for gaps generated between the spaces 29 and 34, and the compact blocks 10$g$ and 11$g$. As mentioned above, at the portions where the compact blocks 10$g$ and 11$g$ and the ceramic green sheets 3$g$ and 8$g$ are mutually opposed, such gap generation is comparatively easily prevented by pressing the composite green laminate 1$g$ perpendicular to the lamination planes via the sheet-like supports 48 and 49. However, at the portions where the inside walls of the spaces 29 and 34 extending perpendicular to the lamination planes and the compact blocks 10$g$ and 11$g$ and the ceramic green sheets 3$g$ and 8$g$ are mutually opposed, a restraining force transmitted via the sheet-like supports 48 and 49 has insufficient effect and gaps are easily generated.

The above-mentioned expansion phenomenon of the paste 50$g$ is particularly effective in compensating gaps generated at the portions where the inside walls of the spaces 29 and 34 extending perpendicular to the lamination planes and the compact blocks 10$g$ and 11$g$ and the ceramic green sheets 3$g$ and 8$g$ are mutually opposed.

When the paste 50$g$ is not provided or the paste 50$g$ is provided but contains no metal mentioned above, gaps might be generated at the portions where the inside walls of the spaces 29 and 34 extending perpendicular to the lamination planes and the compact blocks 10$g$ and 11$g$ and the ceramic green sheets 3$g$ and 8$g$ are mutually opposed. In this case, the surface of the obtained multi-layer ceramic substrate might contain concave dimples. In more severe cases, generation of cracks extending perpendicular to the lamination planes at the surface of the multi-layer ceramic substrate and the interface thereof with a passive component has been experimentally confirmed.

As the present invention is described herein with reference to the illustrated figures of the embodiment, a variety of modifications may be possible within the scope of the present invention.

For example, the circuit design employed in the illustrated multi-layer ceramic substrate 1 is merely a typical example which enables easier understanding of the present invention, and the invention can be equally applied to multi-layer ceramic substrates having any of a variety of wiring designs.

The compact blocks are not limited to a single component such as a capacitor or an inductor, and an LC composite component may be applied.

In the above-described preferred embodiment, the spaces 29 and 34 for receiving the compact blocks 10$g$ and 11$g$ are formed by via-holes 30 through 33 and 35 through 38 provided in the ceramic green sheets 4$g$ through 7$g$; however, a space for receiving a compact block may be formed by a concave portion provided in a specific ceramic green sheet, depending on the size and shape of the block.

As described hereinabove, according to the multi-layer ceramic substrate of the present invention and method for producing the same, a passive component built into a laminate having a plurality of laminated ceramic layers provided for the multi-layer ceramic substrate and a wiring conductor is monolithically sintered during simultaneous firing of a laminate and a compact block containing a functional ceramic green material built into the laminate. Therefore, the characteristics possessed by the passive component are substantially determined during the step in which the compact block is obtained. The latent characteristics of the compact block are substantially maintained after sintering. Therefore, if the compact block is produced in an appropriate manner, the characteristics of the passive component built into the multi-layer ceramic substrate are realized as designed. Thus, there are provided multi-layer ceramic substrate having stable qualities. The present invention easily realizes a multi-layer ceramic substrate having multi-functions, high packing density, high precision, and high performance.

The present invention also provides a multilayer ceramic substrate having excellent environmental resistance such as moisture resistance, since the passive component is completely built into the laminate.

According to the present invention, the passive component is three-dimensionally disposed in the multi-layer ceramic substrate to thereby provide a high degree of design freedom, and problems such as signal crosstalk are advantageously prevented.

Also, according to the multi-layer ceramic substrate of the present invention, an interposed layer is formed between an inside wall extending at least perpendicular to the lamination planes of the laminate and the passive component disposed within the space into which a compact block containing a green ceramic functional material for forming the passive component is built. According to the method for producing the same, during the step of firing the laminate the interposed layer is obtained by firing a paste containing a metal which during firing induces oxidation reaction accompanied by expansion and an optional inorganic compound. Therefore, gaps generated between the space and the block are advantageously compensated, to thereby prevent gap-induced generation of dimples and cracks on the surface of the multi-layer ceramic substrate and to thereby obtain a multi-layer ceramic substrate having excellent reliability.

According to the method for producing the multi-layer ceramic substrate of the present invention, there is provided a compact block containing a green ceramic functional material for forming the passive component to be built, and the composite green laminate into which the compact green block is built, and the resultant laminate is fired. Therefore, rigorous control of shrinkage during firing is nor required as compared with the case in which the pre-fired passive component is fired while being built in. This allows use of a wide range of materials for producing the ceramic green sheet forming the laminate.

According to the method for producing the multi-layer ceramic substrate of the present invention, there is provided in advance space for receiving a compact block for forming the passive component in the composite green laminate. Therefore, the planar surface of the obtained multi-layer ceramic substrate is maintained well. Since undesirable deformation and breakage of the wiring conductor can be prevented, high-density wiring can be realized with high dimensional precision and without variation of the characteristics. The number of lamination layers of the ceramic layer which forms the multi-layer ceramic substrate can be increased, to thereby easily produce a multi-layer ceramic substrate having high performance.

According to the method for producing the multi-layer ceramic substrate of the present invention, a composite green laminate is fired while the sheet-like support formed of a green ceramic which is not sintered at the firing temperature of the composite green laminate is provided on each of the principal surfaces located on the edge of the composite green laminate parallel to the lamination planes. Since the sheet-like support is not sintered, no substantial shrinkage is generated, to thereby suppress shrinkage in the X-Y plane (lamination planes) of the composite laminate sandwiched by the sheet-like supports. Therefore, the dimensional precision of the multi-layer ceramic substrate increases to thereby prevent the occurrence of problems, e.g., breakage of minute and high-density wiring. As mentioned above, since the shrinkage in the X-Y plane is suppressed, the sintering behavior of the compact blocks and the ceramic green sheets may be easily synchronized during simultaneous firing thereof with the composite laminate. Thus, any of a wide range of materials may be used for producing the compact blocks and the ceramic green sheets.

When the composite green laminate is fired while a load is preferably applied perpendicular to the lamination planes thereof via the above-mentioned sheet-like supports, interlayer adhesion in the lamination planes of the laminate is enhanced. This reliably prevents generation of undesirable gaps between the spaces and the blocks, as well as expansion phenomenon during firing of a paste containing the above-mentioned metal and the optional inorganic compound.

In the present invention, when at least one species selected from the group consisting of Al, Si, Ti, Fe, Cu, Mo, W, Cr and Zn is used as the metal for forming the interposed layer, there can be effectively induced, during the firing step, oxidation reaction accompanied by expansion.

Also in the present invention, when ceramics, glass, or a mixture of ceramics and glass is used as the inorganic compound in a mixture containing a metal and an inorganic compound or in a paste to form the interposed layer, there can also be effectively induced, during the firing step, oxidation reaction accompanied by expansion.

When the proportions by weight of the metal and inorganic compound in the paste forming the interposed layer are about 100/0 to 5/95, there can be effectively induced expansion phenomenon due to oxidation reaction of the metal.

Also, when the compact block forming a passive component has a lamination structure comprising a multi-layer of internal conductors, there can be obtained a capacitor having high capacitance or an inductor having high inductance.

In the present invention, the composite laminate can be fired at a comparatively low temperature, e.g., 1000° C., when the ceramic functional materials contained in the compact block comprise glass ceramics or a mixture of glass and ceramics or the ceramic insulating materials contained in the ceramic green sheet provided for the composite laminate comprise glass or a mixture of glass and ceramics and the proportions by weight of glass and ceramics is about 100/0 to 5/95. Therefore, there can be used without any problem a wiring conductor containing at least one species selected from the group consisting of Ag, an Ag—Pt alloy, an Ag—Pd alloy, Au, Ni, Pd, Pt, W, Mo and Cu, as a primary component. With regard to the above-mentioned sheet-like support, there can be used a support containing alumina or zirconia, which has comparatively high availability and chemical stability.

While the invention has been particularly shown and described with reference to preferred embodiments thereof, it will be understood by those skilled in the art that the forgoing and other changes in form and details may be made therein without departing from the spirit of the invention.

What is claimed is:

1. A multi-layer ceramic substrate, comprising:
    a laminate containing at least one internal space and comprising a plurality of laminated ceramic insulating material layers and at least one wiring conductor;
    a passive component disposed in the space in the laminate and electrically connected to the wiring conductor; the passive component comprising a monolithically sintered compact block of passive component green ceramic functional material;
    an layer interposed at least between the passive component and a wall of the laminate space extending in a direction perpendicular to lamination plane of the laminate;
    the interposed layer comprising a fired metal which during firing induced an oxidation reaction accompanied by expansion and optionally an inorganic compound.

2. The multi-layer ceramic substrate according to claim 1, wherein the interposed layer is disposed on a wall of the laminate space extending in a direction parallel to the lamination planes of the laminate or on such wall and a face extending therefrom.

3. The multi-layer ceramic substrate according to claim 1, wherein the metal is at least one member selected from the group consisting of Al, Si, Ti, Fe, Cu, Mo, W, Cr and Zn.

4. The multi-layer ceramic substrate according to claim 1, wherein the inorganic compound is present and comprises ceramic, glass or a mixture of ceramics and glass.

5. The multi-layer ceramic substrate according to claim 1, wherein the proportion by weight of the metal and the inorganic compound is about 100/0 to 5/95.

6. The multi-layer ceramic substrate according to claim 1, wherein the passive component comprises a capacitor or an inductor.

7. The multi-layer ceramic substrate according to claim 1, wherein the compact block has a layer structure and contains a multi-layer internal conductor.

8. The multi-layer ceramic substrate according to claim 1, wherein the ceramic functional material of the compact block comprises glass ceramic or a mixture of glass and ceramic.

9. The multi-layer ceramic substrate according to claim 1, wherein each ceramic layer of the laminate comprises glass and the proportion by weight of the glass and a different ceramic is about 100/0 to 5/95.

10. The multi-layer ceramic substrate according to claim 1, wherein the wiring conductor comprises at least one member selected from the group consisting of Ag, Ag—Pt alloy, Ag—Pd alloy, Au, Ni, Pd, Pt, W, Mo and Cu.

11. A multi-layer ceramic substrate, comprising:
    a laminate containing at least one internal space and comprising a plurality of laminated ceramic insulating material layers and at least one wiring conductor comprising at least one member selected from the group consisting of Ag, Ag—Pt alloy, Ag—Pd alloy, Au, Ni, Pd, Pt, W, Mo and Cu;
    a passive component disposed in the space in the laminate and electrically connected to the wiring conductor; the passive component comprising a monolithically sintered, multi-layered compact block of passive component precursor green ceramic functional material containing a multi-layer internal conductor;
    an layer interposed at least between the passive component and a wall of the laminate space extending in a direction perpendicular to lamination plane of the laminate;
    the interposed layer comprising a fired metal which during firing induced an oxidation reaction accompanied by expansion and is at least one member selected from the group consisting of Al, Si, Ti, Fe, Cu, Mo, W, Cr and Zn and an inorganic compound comprising glass in a proportion by weight of the metal to inorganic compound of about 100/0 to 5/95.

12. A method for producing a multi-layer ceramic substrate including a laminate having a plurality of laminated ceramic layers formed of a ceramic insulating material and a wiring conductor, and a passive component built into the laminate and being wired through the wiring conductor, comprising the steps of:
    providing a composite green laminate containing an interior space and comprising a wiring conductor and a plurality of laminated ceramic green sheets, a passive component compact block comprising a green ceramic functional material in the interior space, wherein the ceramic insulating material of the composite green laminate and the ceramic functional material of the compact block are different, and a paste comprising a metal which during firing induces an oxidation reaction accompanied by expansion and optionally an inorganic compound within a gap at least between an inside wall of the space extending perpendicular to the lamination planes of the laminate and the compact block;
    disposing on each of the principal surfaces located at both ends of the composite green laminate with respect to a direction perpendicular to the lamination planes of the laminate, a sheet-like support of a green ceramic which is not sintered at the firing temperature of the composite green laminate;
    firing the composite green laminate in a state in which the composite green laminate is sandwiched by the sheet-like supports; and
    removing the unsintered sheet-like supports.

13. The method according to claim 12, wherein in the step of providing a composite green laminate, said paste is provided in said space between said compact block and an inside wall of the laminate space extending in a direction parallel to the lamination plane of the laminate, or on said inside wall and a face extending therefrom.

14. The method according to claim 12, wherein a load is applied perpendicular to the lamination plane of the composite green laminate via the sheet-like support during the step of firing the composite green laminate.

15. The method according to claim 12, wherein the step of firing the composite green laminate is performed at about 1000° C. or less.

16. The method according to claim 15, wherein the sheet-like support comprises alumina or zirconia.

17. The method according to claim 12, wherein the metal is at least one member selected from the group consisting of Al, Si, Ti, Fe, Cu, Mo, W, Cr and Zn.

18. The method according to claim 12, wherein the inorganic compound or the ceramic functional material contained in the compact block, or both, comprises ceramic, glass or a mixture of ceramic and glass.

19. The method according to claim 12, wherein the proportion by weight of the metal and the inorganic compound is about 100/0 to 5/95.

20. The method according to claim 12, wherein the compact block provided has a layered structure and has a multi-layer internal conductor therein.

21. The method according to claim 20, wherein the wiring conductor or the internal conductor, or both, comprises at least one member selected from the group consisting of Ag, Ag—Pt alloy, Ag—Pd alloy, Au, Ni, Pd, Pt, W, Mo and Cu.

22. The method according to claim 12, wherein the ceramic insulating material contained in the ceramic green sheet provided in the composite laminate comprises glass and the proportion by weight of the glass and another ceramic in the ceramic green sheet is about 100/0 to 5/95.

* * * * *